United States Patent
Sato

(10) Patent No.: US 7,497,095 B2
(45) Date of Patent: Mar. 3, 2009

(54) METHOD FOR PRODUCING QUARTZ GLASS JIG AND QUARTZ GLASS JIG

(75) Inventor: Tatsuhiro Sato, Koriyama (JP)

(73) Assignees: Heraeus Quarzglas GmbH & Co. KG, Hanau (DE); Shin-Estu Quartz Products Co., Ltd., Tokyo (JP)

( * ) Notice: Subject to any disclaimer, the term of this patent is extended or adjusted under 35 U.S.C. 154(b) by 543 days.

(21) Appl. No.: 10/824,337

(22) Filed: Apr. 13, 2004

(65) Prior Publication Data

US 2004/0237589 A1 Dec. 2, 2004

(30) Foreign Application Priority Data

Apr. 21, 2003 (JP) .............................. 2003-115825

(51) Int. Cl.
*C03B 11/00* (2006.01)

(52) U.S. Cl. .............................. 65/310; 501/54; 65/17.2; 65/17.4; 438/708; 438/709; 438/705; 438/706; 216/63; 216/66; 216/79; 216/62

(58) Field of Classification Search ....................... 65/31
See application file for complete search history.

(56) References Cited

U.S. PATENT DOCUMENTS

| 3,511,727 A | * | 5/1970 | Hays ............................. 117/97 |
| 6,077,451 A | * | 6/2000 | Takenaka et al. ............... 216/79 |
| 6,124,211 A | * | 9/2000 | Butterbaugh et al. ......... 438/708 |

FOREIGN PATENT DOCUMENTS

| JP | 05301731 A |   | 11/1993 |
| JP | 07183240 A | * | 7/1995 |
| JP | 08183621 A |   | 7/1996 |
| JP | 10114532 A | * | 5/1998 |

OTHER PUBLICATIONS

Patent Abstracts of Japan, vol. 1995, No. 10, Nov. 30, 1995, for JP 07 183240 A (Jul. 21, 1995).
Patent Abstracts of Japan, vol. 1996, No. 11, Nov. 29, 1996, for JP 08 183621 A (Jul. 16, 1996).
Patent Abstracts of Japan, vol. 018, No. 101, Feb. 18, 1994, for JP 05 301731 A (Nov. 16, 1993).

* cited by examiner

*Primary Examiner*—Philip C Tucker
*Assistant Examiner*—Phu H Nguyen
(74) *Attorney, Agent, or Firm*—Tiajoloff and Kelly

(57) ABSTRACT

The invention provides a method for producing a quartz glass jig for use in semiconductor industries, which enables increasing the surface layer cleanliness simply and surely at low cost; it also provides a quartz glass jig improved in surface layer cleanliness. The inventive means for resolution are a method comprising processing a quartz glass raw material into a desired shape by a treatment inclusive of fire working, annealing for stress removal, and cleaning treatment to obtain the final product, the method is characterized by that it comprises performing gas phase etching step and gas phase purification step on the surface layer of the quartz glass jig after applying the annealing treatment for stress removal but before the cleaning treatment, wherein the gas phase purification step is carried out continuously after the gas phase etching step.

16 Claims, 4 Drawing Sheets

Product (Quartz glass jig)

Product (Quartz glass jig)

METHOD FOR PRODUCING QUARTZ GLASS JIG AND QUARTZ GLASS JIG

PRIORITY APPLICATION

This application claims the benefit of Japanese Patent Application no. 2003-115825, which was filed on Apr. 21, 2003.

TECHNICAL FIELD TO WHICH THE INVENTION BELONGS

The present invention relates to a method for the manufacture of a quartz glass jig used in a semiconductor industry and also to natural and synthetic quartz glass jig manufactured by the above method for the manufacture of a quartz glass jig.

PRIOR ART

With regard to a quartz glass jig used in a semiconductor industry, natural quartz glass raw material is made into a desired shape by a flame process or the like, subjected to a strain-removing annealing or the like and then washed to give a product.

In the quartz glass jig manufactured as such, metal impurities are diffused in the depth direction to an extent of 100 μm (surface layer) from the surface during a high-temperature thermal treating step in the processing steps and, in the washing treatment of the surface layer which is the final step, contamination takes place to such a depth that is unable to be removed. Such metal impurities are released upon the high-temperature thermal treatment in the manufacturing steps for semiconductors and adhere to silicon wafers resulting in a cause for defective products. Especially, release of metal impurities such as Li, Na, Mg, Al, K, Ca, Ti, Cr, Fe, Ni and Cu which is a problem in the use in semiconductor industry is not preferred.

As a countermeasure therefor, there have been attempted that an atmosphere in a chamber in the step for the manufacture of quartz glass jig is made clean, that a burner for a flame processing is prepared by a quartz glass, that an anneal furnace where the furnace wall is produced by a special clean material is used, etc.

PROBLEMS THAT THE INVENTION IS TO SOLVE

In the quartz glass jig prepared by the above-mentioned methods, it is true that contamination of the surface layer part is reduced and that, when used in a semiconductor industry, defect in silicon wafers is little and advantages are confirmed. However, when those countermeasures are carried out either wholly or separately, the cost and troublesome therefor are very big burden in the sale and the manufacture.

An object of the present invention is to provide a method for the manufacture of a quartz glass jig whereby degree of cleanness of the surface layer of a quartz glass jig used in a semiconductor industry can be improved at low cost easily and surely and also to provide a quartz glass jig where degree of cleanness of the surface layer is improved.

MEANS FOR SOLVING THE PROBLEMS

In order to solve the above-mentioned problems, the first feature of the method for the manufacture of the quartz glass jig according to the present invention is characterized in that, in a method for the manufacture of a quartz glass jig in which a quartz glass raw material is made into a desired shape by a treatment including a flame process, subjected to a strain-removing annealing and then washed to give a product, a gas-phase etching step and a gas-phase purifying step are carried out on the surface layer of the quartz glass jig after the above strain-removing annealing treatment and before the above washing treatment wherein, after the above gas-phase etching step, the above gas-phase purifying step is carried out continuously.

The second feature of the method for the manufacture of the quartz glass jig according to the present invention is characterized in that, in a method for the manufacture of a quartz glass jig in which a quartz glass raw material is made into a desired shape by a treatment including a flame process, subjected to a strain-removing annealing and then washed to give a product, a gas-phase etching step and a gas-phase purifying step are carried out on the surface layer of the quartz glass jig after the above strain-removing annealing treatment and before the above washing treatment wherein the above gas-phase etching step and the above gas-phase purifying step are carried out at the same time.

The third feature of the method for the manufacture of the quartz glass jig according to the present invention is characterized in that, in a method for the manufacture of a quartz glass jig in which a quartz glass raw material is made into a desired shape by a treatment including a flame process, subjected to a strain-removing annealing and then washed to give a product, a gas-phase etching step and a gas-phase purifying step are carried out on the surface layer of the above quartz glass jig together with the above strain-removing annealing treatment wherein, after the above gas-phase etching step, the above gas-phase purifying step is carried out continuously.

The fourth feature of the method for the manufacture of the quartz glass jig according to the present invention is characterized in that, in a method for the manufacture of a quartz glass jig in which a natural quartz glass raw material is made into a desired shape by a treatment including a flame process, subjected to a strain-removing annealing and then washed to give a product, a gas-phase etching step and a gas-phase purifying step are carried out on the surface layer of the above quartz glass jig together with the above strain-removing annealing treatment wherein the above gas-phase etching step and the above gas-phase purifying step are carried out at the same time.

In the above gas-phase etching step, it is advantageous that the treatment is carried out within a temperature range of 0° C. to 1300° C., more preferably 200° C. to 1300° C. or, still more preferably, 800° C. to 1300° C. in an etching gas such as a gas atmosphere containing F. It is desirable that the above gas-phase etching step is carried out for 15 minutes or longer.

With regard to the above gas containing F, at least one member selected from a group consisting of $C_xF_y$, $Cl_xF_y$, $N_xF_y$, $Si_xF_y$, $S_xF_y$ (here, x and y in each formula are $10 \geq x \geq 1$ and $10 \geq y \geq 1$), $CHF_3$, HF and $F_2$ is advantageously used. With regard to the gas containing F, it is not limited to the above so far as it is in a gaseous state at 0° C. to 1300° C. and reacts with quartz glass and a compound with metal element such as $BF_3$ and $PF_3$ may be used as well.

When the temperature for the gas-phase etching treatment is lower than the boiling point temperature of the above-mentioned gas, the gas may be sometimes supplied as a gas in such a state where fine particles of liquid are scattered therein but, even in such a case, the same effect is able to be achieved. Accordingly, as an etching gas used in the gas-phase etching step of the specification of the present application, it is a matter of course that an etching gas in a gas phase or, in other words, in a state of gas is used but, besides that, the above-mentioned etching gas in which fine particles of liquid are scattered therein is included as well. In addition, it is more preferred that the above-mentioned gas atmosphere containing F further contains H. For example, $H_2$ or $H_2O$ gas may be contained therein.

In the above-mentioned gas-phase purifying step, it is advantageous to carry out a high-temperature thermal treatment within a temperature range of 800 to 1300° C. in a gas atmosphere containing Cl. It is preferred that the above gas-phase purifying step is carried out for 15 minutes or longer. It is preferred that the above gas containing Cl is HCl and/or $Cl_2$.

When the gas-phase etching step and the gas-phase purifying step are carried out at the same time, it is advantageous that a high-temperature thermal treatment is carried out for 30 minutes or longer at the temperature range of 800 to 1300° C. in an atmosphere in which the above-mentioned gas containing F and the above-mentioned gas containing Cl are mixed.

The natural quartz glass jig of the present invention is a quartz glass jig manufactured by the method for the manufacture of the quartz glass jig of the present invention and it is characterized in that the above quartz glass raw material is natural quartz glass and concentration of each of Li, Na, Mg, K, Fe, Cr, Ni and Cu until the depth of 100 μm from the surface (surface layer) is less than 50 ppb.

The synthetic quartz glass jig of the present invention is a quartz glass jig manufactured by the method for the manufacture of the quartz glass jig of the present invention and it is characterized in that the above quartz glass raw material is synthetic quartz glass and concentration of each of Li, Na, Mg, Al, K, Ca, Ti, Cr, Fe, Ni and Cu until the depth of 100 μm from the surface is less than 50 ppb.

As hereunder, the mode for carrying out the present invention will be illustrated on the basis of the attached drawings and it goes without saying that such a mode for carrying out the invention is shown in an exemplified manner and that various modifications thereof are possible so far as they are not outside the technical idea of the present invention.

BRIEF DESCRIPTION OF THE DRAWINGS

As hereunder, the method for the manufacture of the quartz glass jig of the present invention will be illustrated by referring to FIG. 1 to FIG. 4.

MODE FOR CARRYING OUT THE INVENTION

Figure 1:
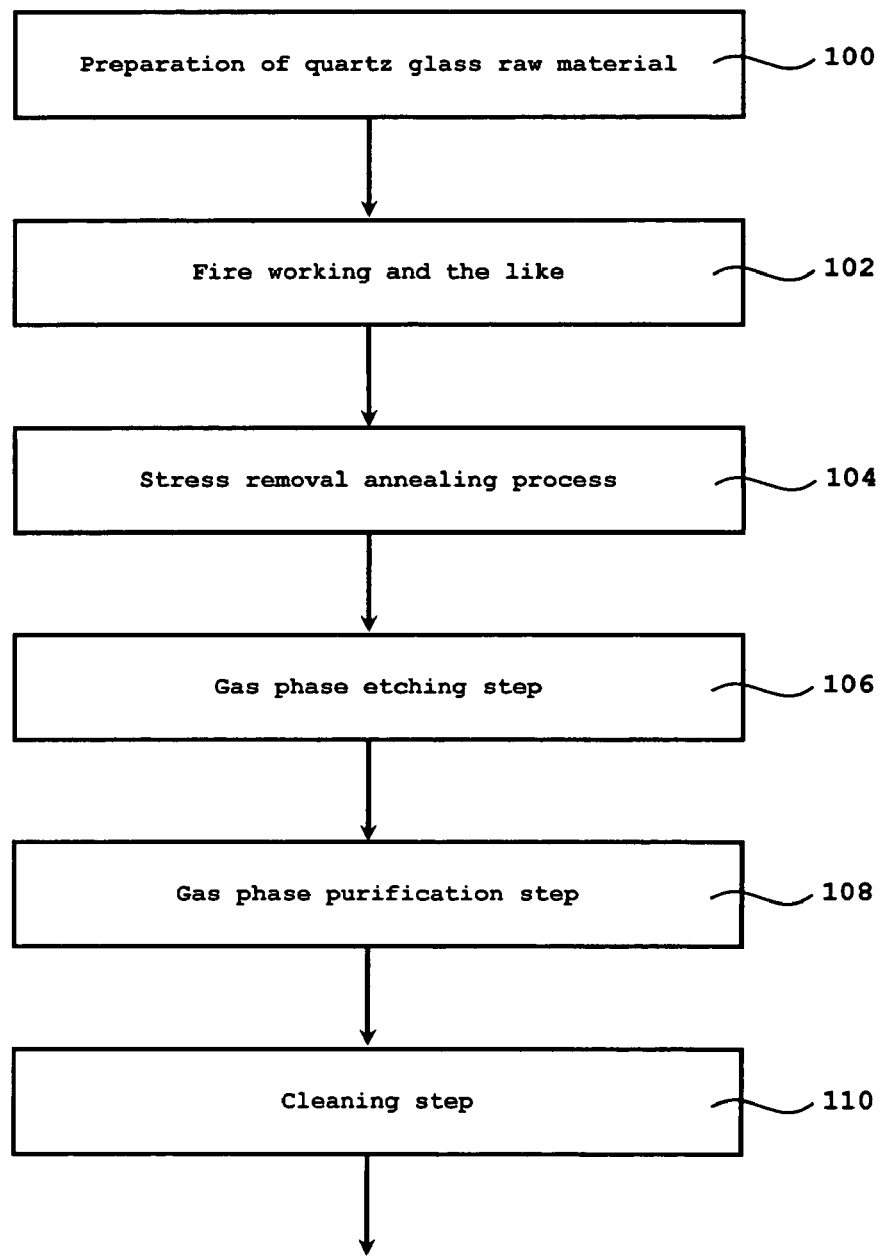
FIG. 1 is a flow chart schematically showing the process steps according to a first embodiment of the method for producing the quartz glass jig according to the present invention.

As shown in FIG. 1, a quartz glass raw material is firstly prepared (step 100), the quartz glass raw material is processed into a desired shape by a flame processing or is subjected to an abrasion treatment (step 102), then subjected to a strain-removing annealing (step 104), subjected to a treatment in a clean atmosphere or, in other words, in an atmosphere containing no metal impurity together with flowing an etching gas (gas-phase etching step; step 106), then subjected to a high-temperature thermal treating together with flowing a gas for purification (purifying gas) (gas-phase purifying step; step 108), cooled down to ambient temperature and subjected to a washing treatment (step 110) to give a product whereupon there is prepared a quartz glass jig where the degree of cleanness of the surface layer is improved.

With regard to a quartz glass raw material in the above step 100, any of natural quartz glass raw material or synthetic quartz glass raw material may be used. When a synthetic quartz glass raw material is used, that where concentration of each of metal impurities such as Li, Na, Mg, Al, K, Ca, Ti, Cr, Fe, Ni and Cu is less than 5 ppb is advantageously used.

With regard to the above-mentioned step 102, step 104 and step 110, there is no particular limitation but the publicly known methods for each of them may be appropriately selected.

It is preferred that the above gas-phase etching step (step 106) is carried out for 15 minutes or longer within a temperature range of 0° C. to 1300° C. The step is to subject the outermost surface layer where contamination during the manufacturing steps for quartz glass is the highest to removal by means of etching. Depth for the etching is necessary to be several μm or more and, preferably, it is conducted to an extent of about 30 μm.

With regard to the above-mentioned etching gas, gas containing F is most common and its examples are $CF_4$, $C_2F_6$, $C_3F_8$, $C_4F_8$, $ClF_3$, $NF_3$, $SiF_4$, $CHF_3$, $SF_6$, HF, $F_2$ and a mixed gas thereof. In the etching, the etching is more effective when conducted after mixing with $H_2$ gas or gas containing H such as $H_2O$.

With regard to the above gas-phase purifying step (step 108), it is preferred that a quartz glass jig which is an object is placed for 15 minutes or longer in a clean atmosphere at the temperature range of 800 to 1300° C. and then subjected to a high-temperature thermal treatment. With regard to the temperature, the effect is noted as from 600° C. but, since it is necessary to set for long time at low temperature range, 800° C. or higher is preferred. When the temperature is higher than 1300° C., deformation may take place in a quartz glass jig which is complicatedly designed and, when it is higher than 1400° C., there is a problem that crystallization rapidly proceeds.

With regard to the above-mentioned purifying gas, a gas containing Cl is common and its examples are HCl, $Cl_2$ and a mixed gas thereof. Inert gas such as nitrogen, argon or helium or a vacuum atmosphere is effective if it is a clean atmosphere. CO gas is also able to be used as a gas which is particularly effective for removal of iron. As a result of the above gas-phase purifying step, at least 100 μm from the surface after the etching is purified.

A specific illustration will be made taking the case where $CF_4$ is used as an etching gas and HCl is used as a purifying gas as an example. Firstly, a quartz glass raw material is prepared, the quartz glass raw material is made into a desired shape by a flame processing or subjected to an abrasion processing, subjected to a strain-removing annealing in an air furnace at 1200° C., then allowed to stand for 15 minutes at 1200° C. together with flowing of $CF_4$ gas thereon, further allowed to stand for 15 minutes together with flowing of HCl gas thereon, cooled down to ambient temperature and subjected to a washing treatment to give a product.

In the above-mentioned method, $CF_4$ gas removes the whole surface of the quartz glass jig to an extent of 5 μm by means of etching and, after that, HCl gas is diffused from the surface layer of the quartz glass jig to an extent of 100 μm, released and reacts with the metal element surrounded by a silica network to form a chloride. Most of the chloride is converted to a gas-phase molecules having a high diffusion coefficient at 600° C. or higher and is quickly diffused and removed to outside from the surface of the quartz glass jig. Even the single substance of metal element not forming a chloride is similarly diffused and removed if it has a big diffusion coefficient whereby the surface layer of the quartz glass jig can be made clean.

Figure 2:
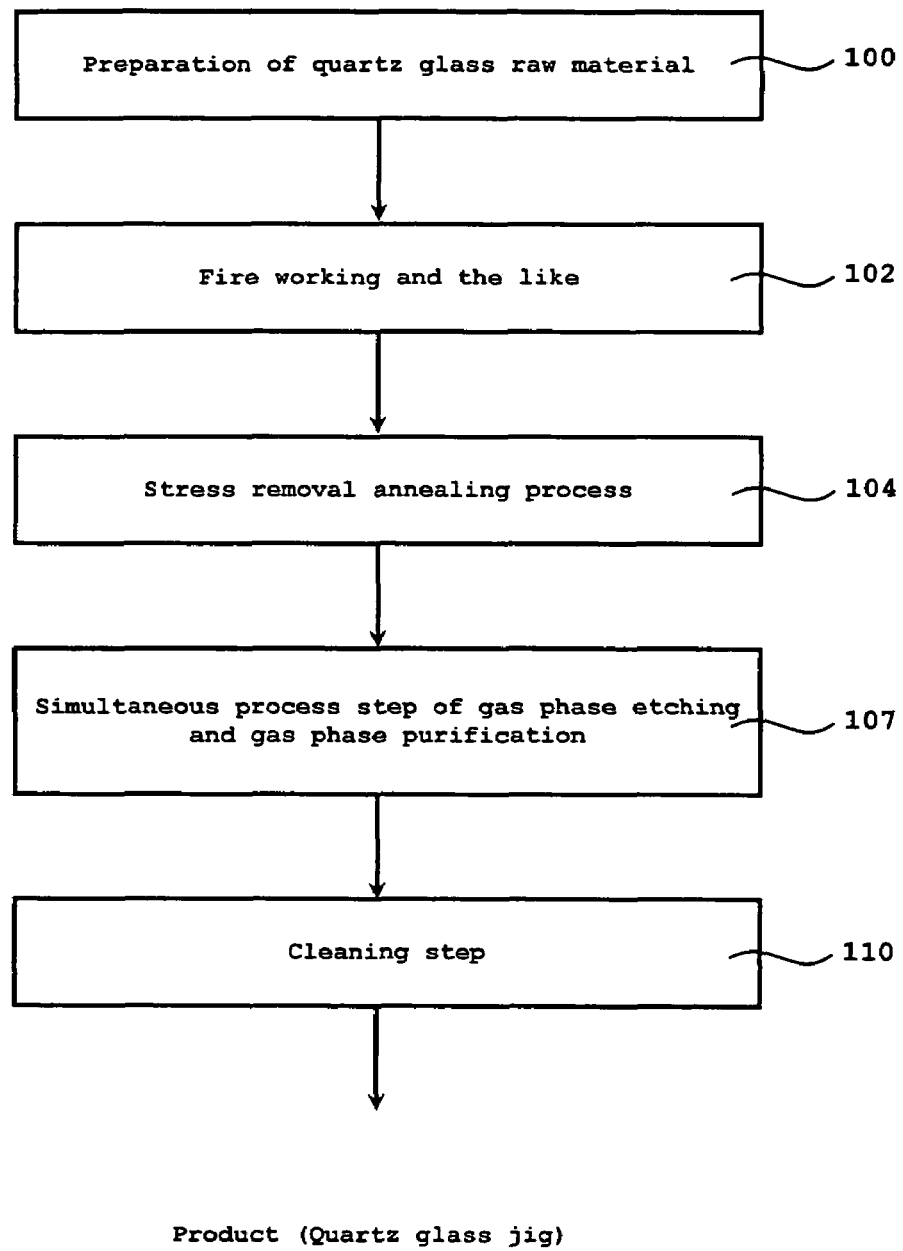
FIG. 2 is a flow chart schematically showing the process steps according to a second embodiment of the method for producing the quartz glass jig according to the present invention.

Further, as shown in FIG. 2, when a high-temperature thermal treatment is carried out in an atmosphere where the above-mentioned etching gas and the above-mentioned purifying gas are mixed, it is possible to simultaneously carry out a gas-phase etching treatment and a gas-phase purifying treatment (step 107).

It is advantageous that, in the above step 107, a heating treatment is carried out for 30 minutes or longer at the temperature range of 800° C. to 1300° C. With regard to the compounding ratio of the mixed gas, it is preferred that each gas is contained in an amount of at least 5% by volume to the total gas flow rate.

Figure 3:
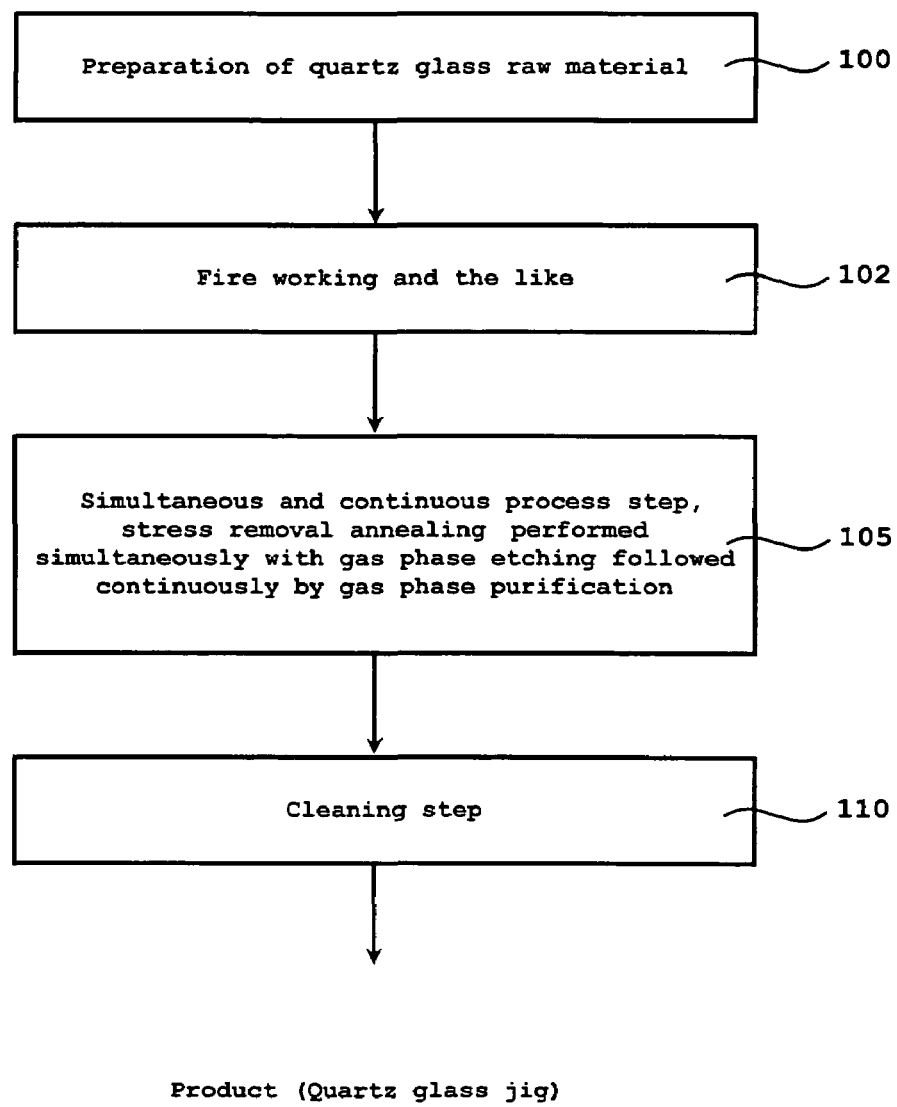
FIG. 3 is a flow chart schematically showing the process steps according to a third embodiment of the method for producing the quartz glass according to the present invention.

Further, as shown in FIG. 3, when a quartz glass raw material is prepared (step 100) and made into a desired shape by a flame processing treatment or the like (step 102) and a strain-removing annealing treatment is carried out together with the above gas-phase etching treatment and the above gas-phase purifying treatment (step 105), it is possible to improve the degree of cleanness of the surface layer of the quartz glass jig. In the step 105, the gas-phase purifying step is carried out after the gas-phase etching step as same as in step 106 and step 108 of FIG. 1.

Figure 4:
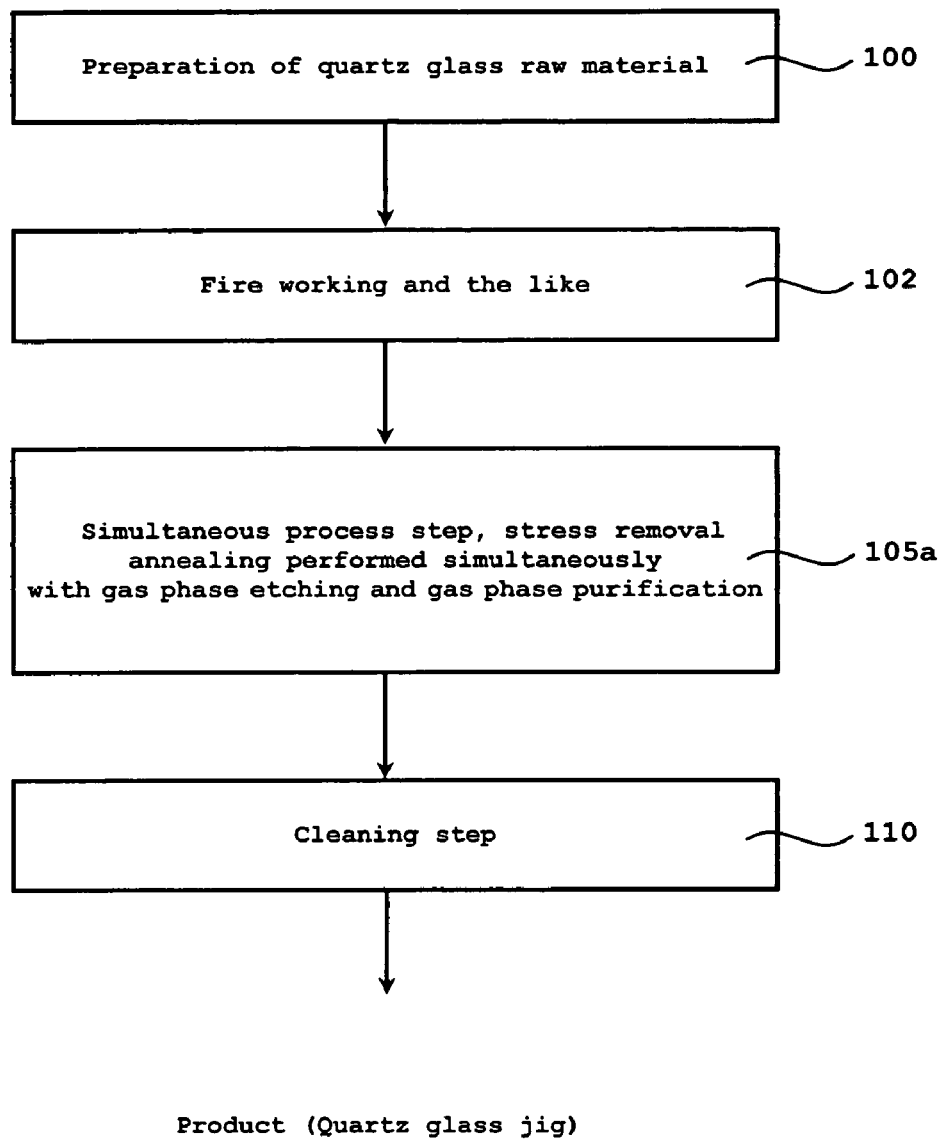
FIG. 4 is a flow chart schematically showing the process steps according to a fourth embodiment of the method for producing the quartz glass according to the present invention.

Still further, as shown in FIG. 4, when a quartz glass raw material is prepared (step 100), made into a desired shape by a flame processing treatment or the like (step 102) and then subjected to a strain-removing annealing treatment, a gas-phase etching treatment and a gas-phase purifying treatment at the same time (step 105a), it is possible to improve the degree of cleanness of the surface layer of the quartz glass jig. In the step 105a, a high-temperature thermal treatment is carried out in an atmosphere where the above etching gas and the above purifying gas are mixed as same as in step 107 of FIG. 2.

The above-mentioned method where a gas-phase etching treatment and a gas-phase purifying treatment are carried out together with a strain-removing annealing treatment (FIG. 3 and FIG. 4) results in shortening of the manufacturing steps as well as making clean whereby that is very efficient.

With regard to the above steps 105 and 105a, it is preferred to carry out them within a range of 800° C. to 1300° C. for at least 30 minutes, more preferably within a range of 1000° C. to 1300° C. and, still more preferably within a range of 1200° C. to 1300° C. and it is most preferred to carry out at 1200° C. which is the common annealing temperature.

In accordance with the above-mentioned first feature to the fourth feature of the method for the manufacture of a quartz glass jig of the present invention, it is now possible that most of contamination of the surface layer during the manufacturing steps of the quartz glass jig is removed and that until 100 μm in the depth direction is made clean to such a high purity that the semiconductor industry demands.

It was clearly confirmed that, in the case of natural quartz glass jig, when concentration of each of the elements Na, K, Li, Mg, Cr, Fe, Ni and Cu to a depth of 100 μm from the surface is low or, in other words, when each concentration is lower than 50 ppb, the jig has an effect as a quartz jig for semiconductor industry. Thus, when it is used for a semiconductor industry even at high temperature, there is no release of metal impurities from the surface layer resulting in no affection to silicon wafers.

It was strongly confirmed that, in the case of synthetic quartz glass jig, when each of Li, Na, Mg, Al, K, Ca, Ti, Cr, Fe, Ni and Cu is less than 50 ppb, the jig has an effect as a quartz jig for semiconductor industry. In that case, with regard to purity of the starting glass raw material, each of all above-mentioned elements is less than 5 ppb.

EXAMPLES

As hereunder, the Examples of the present invention will be specifically illustrated and it goes without saying that those Examples are shown in an exemplified manner and should not be interpreted in a limitative manner.

Example 1

A square rod of 20 mm×20 mm×1300 mm was cut out by a cutter from a quartz glass raw material prepared from natural rock crystal quartz glass powder and 130 grooves of 2 mm width and 5 mm depth were carved in a direction perpendicular to a long axis with intervals of 10 mm. Then the above grooves were subjected to a fire polish by a metal burner using an oxyhydrogen flame to give a smooth and flat surface state.

As shown in Table 1, the grooves of the above quartz glass rod were made into a state of a smooth surface, allowed to stand in an air furnace at 1200° C. for 30 minutes, cooled down to room temperature during one day and taken out. The quartz rod which was taken out was placed in a quartz tube of 300 mm diameter×2000 mm, $CF_4$ gas was flown thereon at 1 liter/minute followed by keeping at 1200° C. for 15 minutes, then HCl gas was flown thereon at 1 liter/minute followed by keeping at 1200° C. for 15 minutes and the rod was cooled down to room temperature during one day, substituted and taken out.

TABLE 1

| | Glass Raw Material | High-Temperature Heating Treatment | Treating Temperature (° C.) |
|---|---|---|---|
| Example 1 | Natural | Strain-removing annealing → $CF_4$ → HCl | 1200 |
| Example 2 | Synthetic | Strain-removing annealing as well as ($CF_4$ → HCl) | 1200 |
| Example 3 | Synthetic | Strain-removing annealing as well as ($CF_4$ + HCl) | 1200 |
| Example 4 | Synthetic | Strain-removing annealing as well as {($CF_4$ + $H_2$) → HCl} | 1200 |
| Comp. Ex. 1 | Synthetic | Strain-removing annealing | 1200 |
| Comp. Ex. 2 | Synthetic | Strain-removing annealing → HCl | 1200 |

From the taken-out quartz glass rod, 100 mm were cut out and the surface layer thereof to an extent of 100 μm from the surface was dissolved in an HF solution followed by subjecting to a chemical analysis. Chemical analysis of the quartz glass rod itself wherefrom the surface layer was removed was conducted as well. With regard to the means for the chemical analysis, a flame atomic absorption and a plasma atom emission were carried out. The result is shown in Table 2. In each element, the same purity as that in the natural quartz glass material which is a raw material was achieved.

TABLE 2

| | Depth of Analysis (μm) | (ppb) | | | | | | | | | | |
|---|---|---|---|---|---|---|---|---|---|---|---|---|
| | | Na | K | Li | Mg | Al | Ca | Ti | Cr | Fe | Ni | Cu |
| Example 1 | 0-100 | 7 | 30 | 10 | 30 | 14000 | 400 | 700 | 10 | 15 | 10 | <5 |
| | 100- | 30 | 110 | 50 | 40 | 14000 | 500 | 800 | 40 | 80 | 30 | <5 |
| Example 2 | 0-100 | <5 | <5 | <5 | <5 | <5 | <5 | <5 | <5 | <5 | <5 | <5 |
| | 100- | <5 | <5 | <5 | <5 | <5 | <5 | <5 | <5 | <5 | <5 | <5 |
| Example 3 | 0-100 | <5 | <5 | <5 | <5 | <5 | <5 | <5 | <5 | <5 | <5 | <5 |
| | 100- | <5 | <5 | <5 | <5 | <5 | <5 | <5 | <5 | <5 | <5 | <5 |
| Example 4 | 0-100 | <5 | <5 | <5 | <5 | <5 | <5 | <5 | <5 | <5 | <5 | <5 |
| | 100- | <5 | <5 | <5 | <5 | <5 | <5 | <5 | <5 | <5 | <5 | <5 |
| Comparative Example 1 | 0-100 | 100 | 150 | 130 | 65 | 100 | 145 | 65 | 85 | 90 | 63 | 55 |
| | 100- | 10 | 5 | 15 | <5 | <5 | <5 | <5 | <5 | <5 | <5 | 5 |
| Comparative Example 2 | 0-100 | <5 | <5 | <5 | 65 | 100 | 110 | 55 | 5 | 5 | 5 | <5 |
| | 100- | <5 | <5 | <5 | <5 | <5 | <5 | <5 | <5 | <5 | <5 | <5 |
| Starting Material | Natural | 30 | 110 | 50 | 40 | 14000 | 500 | 800 | 40 | 80 | 30 | <5 |
| | Synthetic | <5 | <5 | <5 | <5 | <5 | <5 | <5 | <5 | <5 | <5 | <5 |

Unit of the concentration of the element shown in Table 2 is ppb.

Example 2

From a synthetic quartz glass raw material prepared by a soot, a square rod of 20 mm×20 mm×1300 mm was cut out by a cutter and 130 grooves of 2 mm width and 5 mm depth were carved in a direction perpendicular to a long axis with intervals of 10 mm. Then the above grooves were further subjected to a fire polish by a metal burner using an oxyhydrogen flame to give a smooth and flat surface state.

As shown in Table 1, the grooves of the above quartz glass rod were made into a state of a smooth surface and placed in a quartz tube of 300 mm diameter×2000 mm, $CF_4$ gas was flown thereon at 1 liter/minute followed by keeping at 1200° C. for 15 minutes, then HCl gas was flown thereon at 1 liter/minute followed by keeping at 1200° C. for 15 minutes and the rod was cooled down to room temperature during one day, substituted and taken out.

From the taken-out quartz rod, 100 mm were cut out and the each of surface layer thereof to an extent of 100 μm from the surface and the quartz glass rod itself wherefrom the surface layer was removed was dissolved in an HF solution followed by subjecting to a chemical analysis as same as in Example 1. The result is shown in Table 2. In each of the elements, the same purity as that in the synthetic quartz material which is a raw material was achieved.

Example 3

As shown in Table 1, the same treatment as in Example 2 was carried out so that grooves of the quartz glass rod were made into a state of a smooth surface and placed in a quartz tube of 300 mm diameter×2000 mm, each 1 liter/minute of $CF_4$ gas and HCl gas was flown thereon followed by keeping at 1200° C. for 30 minutes and the rod was cooled down to room temperature during one day, substituted and taken out. As shown in Table 2, the result was also as same as that in Example 2.

Example 4

As shown in Table 1, the same treatment as in Example 2 was carried out so that grooves of the quartz glass rod were made into a state of a smooth surface and placed in a quartz tube of 300 mm diameter×2000 mm, $CF_4$ gas and $H_2$ gas were flown at the rate of 1 liter/minute thereon followed by keeping at 1200° C. for 15 minutes, then HCl gas was flown thereon at the rate of 1 liter/minute thereon followed by keeping at 1200° C. for 15 minutes and the rod was cooled down to room temperature during one day, substituted and taken out. As shown in Table 2, the result was also as same as that in Example 2.

Comparative Example 1

A synthetic quartz glass raw material prepared by a soot was used and, by the same process as in Example 2, grooves of the cut-out quartz glass rod were made into a state of smooth surface and the rod was allowed to stand in an air furnace at 1200° C. for 30 minutes, cooled down to room temperature during one day and then taken out.

From the taken-out quartz glass rod, 100 mm were cut out and each of the surface layer thereof to an extent of 100 μm from the surface and the quartz glass rod itself wherefrom the surface layer was removed was dissolved in an HF solution followed by subjecting to a chemical analysis as same as in Example 1. The result is shown in Table 2. As shown in Table 2, in the surface layer, concentration of any element was higher than that in the starting material.

Comparative Example 2

A synthetic quartz glass raw material prepared by a soot was used and, by the same process as in Example 2, grooves of the cut-out quartz glass rod were made into a state of smooth surface and the rod was allowed to stand in an air furnace at 1200° C. for 30 minutes, cooled down to room temperature during one day and then taken out. After that, it was placed in a quartz tube of 300 mm diameter×2000 mm, HCl gas was flown thereon at the rate of 1 liter/minute followed by keeping at 1200° C. for 15 minutes and the rod was cooled down to room temperature during one day, substituted and taken out.

From the taken-out quartz rod, 100 mm were cut out and each of the surface layer thereof to an extent of 100 μm from the surface and the quartz glass rod itself wherefrom the surface layer was removed was dissolved in an HF solution followed by subjecting to a chemical analysis as same as in Example 1. The result is shown in Table 2. As shown in Table 2, in the surface layer, concentration of any element was lower than that in Comparative Example 1 but higher than that in the starting material.

ADVANTAGE OF THE INVENTION

As mentioned above, in accordance with the method for the manufacture of a quartz glass jig of the present invention, it is possible that, with regard to a quartz glass jig used in a semiconductor industry, most of contamination in the surface layer during the steps is removed at low cost and in easy and sure manner whereby degree of cleanness of the surface layer is improved. The quartz glass jig of the present invention is a quartz glass jig where degree of cleanness of the surface layer is improved which is easily prepared by the method for the manufacture of a quartz glass jig of the present invention.

What is claimed is:

1. A method for producing a quartz glass jig, said method comprising: processing a quartz glass raw material into a desired shape of the quartz glass jig by a treatment including fire working, annealing a product of the desired shape so as to remove stress therein, and performing a cleaning treatment on the product to obtain a final product, wherein a gas phase etching step and a gas phase purification step are performed on a surface layer of the product after the annealing but before the cleaning treatment, and wherein the gas phase purification step is carried out continuously after the gas phase etching step,
    wherein the gas phase etching step is performed so as to remove a portion of the surface layer in a fluorine-containing gaseous atmosphere that contains at least one gas selected from the group consisting of $C_xF_y$, $Cl_xF_y$, $N_xF_y$, $Si_xF_y$, $S_xF_y$ (where, $10 \geq x \geq 1$ and $10 \geq y \geq 1$), $CHF_3$, $HF$, and $F_2$, and
    wherein the gas phase purification step comprises performing a high temperature heat treatment in a temperature range of from 800 to 1300° C. in a gaseous atmosphere containing Cl.

2. A method for producing a quartz glass jig as claimed in claim 1, wherein the gas phase etching step is performed in a temperature range of from 0° C. to 1300° C. in the fluorine-containing gaseous atmosphere.

3. A method for producing a quartz glass jig as claimed in claim 1, wherein the gaseous atmosphere containing Cl is HCl, $Cl_2$, or a combination of HCl and $Cl_2$.

4. A method for producing a quartz glass jig as claimed in claim 2, wherein the fluorine-containing gaseous atmosphere further includes a gas containing H.

5. A method for producing a quartz glass jig, said method comprising:
    processing a quartz glass raw material into a desired shape of the quartz glass jig by a treatment including fire working, annealing a product of the desired shape so as to remove stress therein, and performing a cleaning treatment on the product to obtain a final product, wherein a gas phase etching step and a gas phase purification step are performed on a surface layer of the product after the annealing but before the cleaning treatment, and wherein the gas phase purification step is carried out simultaneously with the gas phase etching step,
    wherein the gas phase etching step is performed so as to remove a portion of the surface layer in a fluorine-containing gaseous atmosphere that contains at least one gas selected from the group consisting of $C_xF_y$, $Cl_xF_y$, $N_xF_y$, $Si_xF_y$, $S_xF_y$ (where $10 \geq x \geq 1$ and $10 \geq y \geq 1$), $CHF_3$, $HF$, and $F_2$, and
    wherein the gas phase purification step comprises performing a high temperature heat treatment in a temperature range of from 800 to 1300° C. in a gaseous atmosphere containing Cl.

6. A method for producing a quartz glass jig as claimed in claim 5, wherein the gas phase etching step is performed in a temperature range of from 0° C. to 1300° C. in the fluorine-containing gaseous atmosphere.

7. A method for producing a quartz glass jig as claimed in claim 5, wherein the gaseous atmosphere containing Cl is HCl, $Cl_2$, or a combination of HCl and $Cl_2$.

8. A method for producing a quartz glass jig as claimed in claim 6, wherein the fluorine-containing gaseous atmosphere further includes a gas containing H.

9. A method for producing a quartz glass jig, said method comprising:
    processing a quartz glass raw material into a desired shape of the quartz glass jig by a treatment including fire working, annealing the quartz glass jig so as to remove stress therein, and performing a cleaning treatment on the product to obtain a final product, wherein a gas phase etching step and a gas phase purification step are performed on a surface layer of the product simultaneously with the annealing, and wherein the gas phase purification step is carried out continuously after the gas phase etching step,
    wherein the gas phase etching step is performed so as to remove a portion of the surface layer in a fluorine-containing gaseous atmosphere that contains at least one gas selected from the group consisting of $C_xF_y$, $Cl_xF_y$, $N_xF_y$, $Si_xF_y$, $S_xF_y$ (where $10 \geq x \geq 1$ and $10 \geq y \geq 1$), $CHF_3$, $HF$, and $F_2$, and
    wherein the gas phase purification step comprises performing a high temperature heat treatment in a temperature range of from 800 to 1300° C. in a gaseous atmosphere containing Cl.

10. A method for producing a quartz glass jig as claimed in claim 9, wherein the gas phase etching step is performed in a temperature range of from 0° C. to 1300° C. in the fluorine-containing gaseous atmosphere.

11. A method for producing a quartz glass jig as claimed in claim 9, wherein the gaseous atmosphere containing Cl is HCl, $Cl_2$, or a combination of HCl and $Cl_2$.

12. A method for producing a quartz glass jig as claimed in claim 10, wherein the fluorine-containing gaseous atmosphere further includes a gas containing H.

13. A method for producing a quartz glass jig, said method comprising: processing a quartz glass raw material into a desired shape of the quartz glass jig by a treatment including fire working, annealing a product of the desired shape so as to remove stress therein, and performing a cleaning treatment on the product to obtain a final product, wherein a gas phase etching step and a gas phase purification step are performed on a surface layer of the product simultaneously with the annealing, and wherein the gas phase purification step is carried out simultaneously with the gas phase etching step,
    wherein the gas phase etching step is performed so as to remove a portion of the surface layer in a fluorine-containing gaseous atmosphere that contains at least one gas selected from the group consisting of $C_xF_y$, $Cl_xF_y$, $N_xF_y$, $Si_xF_y$, $S_xF_y$ (where, $10 \geq x \geq 1$ and $10 \geq y \geq 1$), $CHF_3$, $HF$, and $F_2$, and
    wherein the gas phase purification step comprises performing a high temperature heat treatment in a temperature range of from 800 to 1300° C. in a gaseous atmosphere containing Cl.

14. A method for producing a quartz glass jig as claimed in claim 13,
    wherein the gas phase etching step is performed in a temperature range of from 0° C. to 1300° C. in the fluorine-containing gaseous atmosphere.

15. A method for producing a quartz glass jig as claimed in claim 13,
    wherein the gaseous atmosphere containing Cl is HCl, $Cl_2$, or a combination of HCl and $Cl_2$.

16. A method for producing a quartz glass jig as claimed in claim 14,
    wherein the fluorine-containing gaseous atmosphere further includes a gas containing H.

* * * * *